United States Patent [19]
Wise et al.

[11] 3,888,708
[45] June 10, 1975

[54] METHOD FOR FORMING REGIONS OF PREDETERMINED THICKNESS IN SILICON

[76] Inventors: Kensall D. Wise, 965 Buckeye Crt., Sunnyvale, Calif. 94086; Samaun, Bandung Institute of Technology, Djl. Ganeco 10, Bandung, Indonesia

[22] Filed: Apr. 10, 1974

[21] Appl. No.: 459,713

Related U.S. Application Data

[63] Continuation of Ser. No. 227,027, Feb. 17, 1972, abandoned.

[52] U.S. Cl. .................. 156/11; 156/17
[51] Int. Cl. .................. H011 7/50
[58] Field of Search .................. 357/26; 29/580, 583; 156/8, 11, 17; 252/79.5

[56] References Cited

UNITED STATES PATENTS 2,944,321 7/1960 Westberg .................. 156/11 X
3,493,820 2/1970 Rosvold .................. 156/17 X
3,725,160 4/1973 Bean et al. .................. 156/17
3,757,414 9/1973 Keller .................. 29/580

*Primary Examiner*—William A. Powell
*Attorney, Agent, or Firm*—Flehr, Hohbach, Test, Albritton & Herbert

[57] ABSTRACT

A method for forming thin regions of predetermined thickness in a silicon wafer which comprises the steps of applying an etchant resist mask on the faces of the wafer, opening a slot of predetermined width in the mask on one face to expose the underlying silicon, removing the mask from all areas of the other face where the thin regions are to be formed including removal opposite said slot, etching the wafer until the back surface of the thin region reaches the groove etched at the slot and then quenching the etch.

5 Claims, 5 Drawing Figures

METHOD FOR FORMING REGIONS OF PREDETERMINED THICKNESS IN SILICON

GOVERNMENT GRANT

The invention described herein was made in the course of work under a grant or award from the National Aeronautics and Space Administration.

This is a continuation, of application Ser. No. 227,027 filed Feb. 17, 1972, now abandoned.

BACKGROUND OF THE INVENTION

This invention relates generally to the formation of thin regions of predetermined thickness in silicon and more particularly to a method employing anisotropic etching in a silicon wafer.

In many applications it is important to form thin areas of silicon. For example, thin areas of predetermined thickness find application in pressure sensors. The thin areas form a diaphragm which is moved by the pressure. Piezoresistors are formed on the diaphragm and interconnected to give an indication of the amount of movement of the diaphragm which is a measure of the pressure. In the typical situation, the silicon wafers in which the thin regions are formed are in the order of 50 microns thick or more. The excess silicon is removed from selected portions of the wafer, usually from the back surface, until areas of predetermined thickness, 10 microns or less, are formed. Existing techniques for forming such thin regions of predetermined thickness in a silicon wafer have relied upon the knowledge of etch rate and the original thickness of the wafer or the use of electro-chemical techniques in connection with PN junctions. These approaches have been largely unsatisfactory. Etch rates lack the precision required and are a strong function of both the etch composition and temperature. Electro-chemical techniques are difficult to employ and the PN junctions needed are often inconvenient or impossible to incorporate in the device processing sequence.

OBJECTS AND SUMMARY OF THE INVENTION

It is a general object of the present invention to provide an improved method for forming regions of predetermined thickness in silicon wafers.

It is another object of the present invention to provide a method for forming thin regions in silicon wafers in which a simple visual indication is given when the desired thickness is reached.

It is another object to provide a method of forming thin regions of predetermined thickness in silicon which are independent of both etch rate and original silicon thickness.

It is another object of the present invention to provide a method of forming thin regions in silicon which depends upon the anisotropic properties of silicon and the fact that certain anisotropic etchants have etch rates several hundred times larger in the (100) crystallographic direction than along the other crystallographic directions.

The foregoing and other objects of the invention are achieved by a method which comprises selecting a silicon body or wafer having its (100) crystallographic plane at opposite faces of the body or wafer, applying an etch resistant mask on the faces, opening a slot of predetermined width on one face to expose the underlying silicon, removing the mask from all areas of the other face where the thin regions are to be formed including removal opposite said slot and subjecting the silicon to an anisotropic silicon etch until the back surface of the thin regions reaches the groove etched at the slot and then quenching the etch whereby to form one or more regions having a thickness equal to the depth of the groove etched at the slot.

DESCRIPTION OF PREFERRED EMBODIMENT

Figure 1:
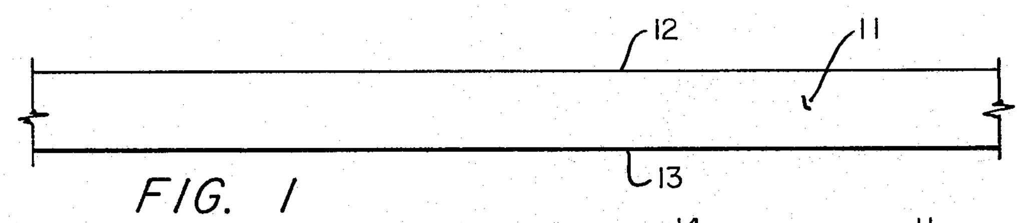
FIG. 1 is a side elevational view in section of a typical silicon wafer.
Figure 2:
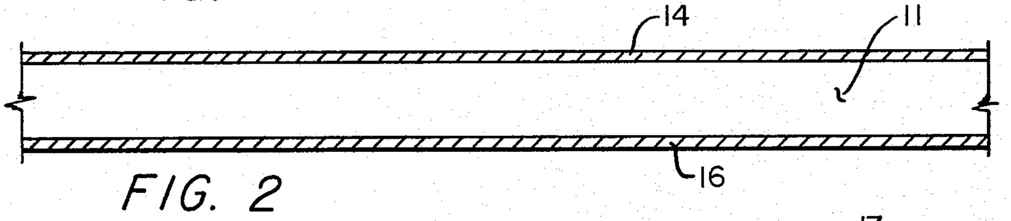
FIG. 2 shows the silicon wafer of FIG. 1 with an etch resistant mask applied to the opposite faces.
Figure 3:
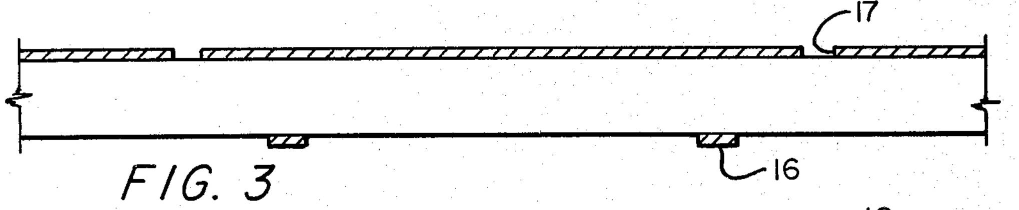
FIG. 3 shows the silicon wafer with a slot formed in the mask on one fact and the mask on the other face removed at those areas where the thin regions are to be formed.
Figure 4:
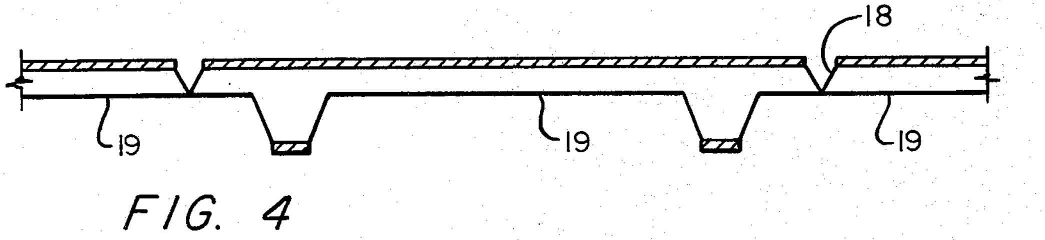
FIG. 4 shows the wafer after etching showing the thin regions of predetermined thickness.

FIG. 1 shows a silicon wafer or body 11 which may be 50 microns or thicker and from which material is to be removed to form a thin region, in the order of 10 microns or less. The silicon wafer 11 is oriented with its (100) crystallographic plane in the direction of the faces 12 and 13. Suitable etch resistant layers or masks 14 and 16 are formed on the opposite faces 12 and 13 of the silicon body 11. For example, where the etchant is potassium hydroxide, the mask may be a thermally grown silicon dioxide film. By use of conventional masking and etching techniques, a narrow slot 17 is formed in the layer 14. As will presently be apparent, the slot 17 can define the device formed. Where ohmic contacts are to be made to the silicon body, the slot may be conveniently formed when the contact windows are opened. In such instances, the metallization used to form the ohmic contacts should not be significantly attacked by the etchant used.

Similarly, on the back side of the wafer the layer 16 is removed in those areas where the thin regions of predetermined thickness are to be formed, leaving the layer 16 on those areas not to be etched. In accordance with the present invention, the masking material 16 is removed from opposite the slot 17.

In accordance with the invention, the thin regions are formed by removal of silicon with an anisotropic etchant. Several such etchants are available for silicon such as hydrazine, pyracatechol and potassium hydroxide. Preferably, potassium hydroxide is used since it is relatively inexpensive, easy to handle and masking is easily accomplished using thermally grown silicon dioxide.

The silicon body with selectively removed layers 14 and 16 are placed in an anisotropic etchant. On the front side, the etch proceeds through the slot 17 formed in the etch resistant layer until a V-shaped groove 18 is formed. The sides of the "V" groove correspond to the (111) crystallographic plane. When the "V" is completed, no (100) crystallographic surface is exposed to the anisotropic etchant and the etching effectively stops on the front side of the wafer. The slot width, therefore, determines the final depth of the "V" groove. The slot width is approximately the square root of two times the depth. It is, therefore, seen that by appropriately selecting the slot width, the depth of the "V" groove can be determined and as will be presently apparent the thickness of the thin region.

As the etch proceeds from the back side of the wafer, more and more material is removed, both from the diaphragm area and from areas not part of the final chip. When the lower surface 19 of the thin region is coextensive with the bottom of the groove, the chip will separate from the wafer. Thus, the closed groove outlines the chip dimension. Thus, by watching for the moment of penetration into the "V" groove and quenching the etch, a thin region of predetermined thickness is formed. The thickness is independent of variations in wafer thicknesses or etch rates. It is apparent that the slot need not define a device or chip. The slot may be used solely for the purpose of providing a visual indication of when the surface 19 has reached the apex of the "V" groove.

Figure 5:
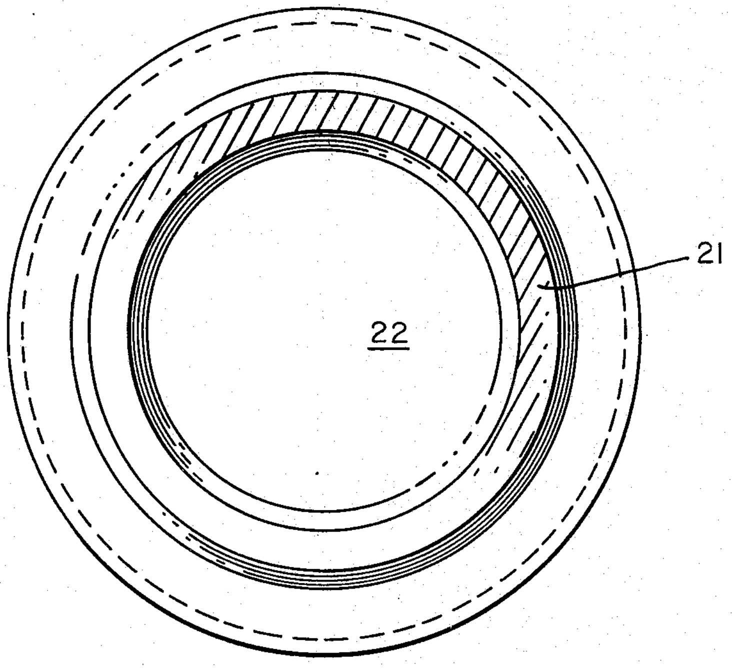
FIG. 5 is a bottom view of a wafer formed as shown in FIGS. 1–4 showing a typical pressure diaphragm region with support ring.

Referring to FIG. 5, there is shown a circular chip in which the outside is defined by the groove 18 and which includes a supporting circular rib structure 21 supporting and defining the diaphragm 22. The diaphragm may be used as the pressure sensitive element of a pressure transducer.

The method described has been used to form diaphragms in silicon with thicknesses in the range of 5 to 7 microns. In one instance, a five micron thick diaphragm was formed by using a seven micron wide slot in a silicon dioxide mask. Cross-sectioning of the diaphragm showed that the thickness was 5.1 microns.

It is to be understood that although formation of a diaphragm has been described that the method is applicable to the formation of thin regions in silicon as needed. The process is fully compatible with integrated circuit batch fabrication. This method described for etching thin diaphragms represents a significant improvement over those previously used since it gives an indication of when the diaphragm has reached the proper thickness. The method is not only important for fabricating diaphragms for pressure sensors but is also applicable in the formation of thin areas of silicon in silicon bodies for other uses.

We claim:

1. A method of etching thin regions of predetermined thickness in a silicon body by use of an anisotropic etchant which comprises the steps of forming a silicon body with its (100) crystallographic plane extending parallel to opposite faces of the body, applying a layer resistant to the etchant to each of the opposite faces, removing a portion of said resistant layer from one face to form a slot of predetermined width in said layer to expose the underlying silicon, removing portions of the resistant layer from the opposite face in areas where the thin region of predetermined thickness is to be formed including removal of the resistant layer directly opposite said slot, subjecting the silicon body to said anisotropic etchant to remove silicon from the exposed areas on both faces, said etchant serving to form a groove of predetermined depth at said slot of predetermined width and quenching the etch when the silicon is removed to an extent that the etched opposite surface reaches the bottom of the groove.

2. The method as in claim 1 wherein the groove defines a closed area whereby when the etching is completed a device is separated from the silicon body.

3. The method as in claim 2 wherein removal of the resistant layer from the opposite face leaves a closed ring which after etching leaves silicon material to support the diaphragm formed within the ring.

4. The method of etching, to a predetermined thickness, a preselected area of a silicon wafer and leaving around said area a peripheral rib of thickness greater than said predetermined thickness, said wafer being formed of silicon with its 1, 0, 0 crystallographic plane extending in the direction of 0 wafer faces, said method comprising:

forming on a first face of said wafer a resist pattern corresponding to the desired contour of said rib, said pattern exposing, on said first face, the preselected area of said wafer which is to be etched to said predetermined thickness and exposing also at least an annular portion of said first face surrounding the resist pattern corresponding to said rib;

forming on the other face of said wafer a resist pattern which covers said preselected area and which provides, peripherally of said area, a slot of a predetermined width corresponding to said preselected thickness, said slot being opposite said exposed annular portion provided by the resist pattern on said first face;

subjecting the wafer to an anisotropic etchant to etch, in said other face, a V-shaped groove beneath said slot and to etch silicon away from said first face esentially uniformly over said preselected area and over said annular portion; and quenching said etching when said annular portion is etched through said wafer to the bottom of said V-shaped groove.

5. The method as set forth in claim 4 wherein the desired contour of said rib is generally circular.

* * * * *